US012740045B2

(12) United States Patent
Chiu et al.

(10) Patent No.: US 12,740,045 B2
(45) Date of Patent: Sep. 15, 2026

(54) SEMICONDUCTOR STRUCTURE AND MANUFACTURING METHOD THEREOF

(71) Applicant: Winbond Electronics Corp., Taichung City (TW)

(72) Inventors: Pin-Han Chiu, Taichung City (TW); Feng-Jung Chang, Taichung City (TW)

(73) Assignee: Winbond Electronics Corp., Taichung City (TW)

(*) Notice: Subject to any disclaimer, the term of this patent is extended or adjusted under 35 U.S.C. 154(b) by 522 days.

(21) Appl. No.: 18/155,682

(22) Filed: Jan. 17, 2023

(65) Prior Publication Data

US 2024/0244822 A1 Jul. 18, 2024

(51) Int. Cl.
*H10B 12/00* (2023.01)
*H10W 20/41* (2026.01)

(52) U.S. Cl.
CPC ........... *H10B 12/315* (2023.02); *H10B 12/02* (2023.02); *H10B 12/482* (2023.02); *H10W 20/435* (2026.01)

(58) Field of Classification Search
CPC .. H10B 12/315; H10B 12/482; H01L 23/5283
See application file for complete search history.

(56) References Cited

U.S. PATENT DOCUMENTS

| | | | | |
|---|---|---|---|---|
| 8,541,316 | B2 * | 9/2013 | Sukekawa | H10P 50/73 438/421 |
| 8,772,167 | B2 | 7/2014 | Seo et al. | |
| 9,070,640 | B2 | 6/2015 | Gwak | |
| 10,049,877 | B1 * | 8/2018 | Shih | H10P 76/4085 |
| 10,096,603 | B2 | 10/2018 | Kim et al. | |
| 10,340,149 | B2 | 7/2019 | Shih et al. | |
| 2011/0284841 | A1 * | 11/2011 | Kondou | H10P 74/273 257/E23.079 |
| 2014/0273471 | A1 * | 9/2014 | Gwak | H10P 50/73 438/702 |
| 2022/0278063 | A1 * | 9/2022 | Hu | H10W 20/40 |
| 2023/0187352 | A1 * | 6/2023 | Roh | H10D 1/716 257/296 |
| 2024/0244822 | A1 * | 7/2024 | Chiu | H10B 12/02 |

OTHER PUBLICATIONS

"Office Action of Taiwan Counterpart Application", issued on Sep. 20, 2023, p. 1-p. 6.

* cited by examiner

*Primary Examiner* — Steven M Page
(74) *Attorney, Agent, or Firm* — JCIPRNET

(57) ABSTRACT

A semiconductor structure including a substrate, multiple first pads, and multiple second pads is provided. The first pads are disposed on the substrate and are separated from each other. The second pads are disposed on the substrate and are separated from each other. Each of the first pads and each of the second pads are separated from each other. A top-view shape of the each of the first pads is different from a top-view shape of the each of the second pads. A portion of the first pads surrounds the same second pad.

19 Claims, 27 Drawing Sheets

SEMICONDUCTOR STRUCTURE AND MANUFACTURING METHOD THEREOF

BACKGROUND

Technical Field

This disclosure relates to a semiconductor structure and a manufacturing method thereof, and in particular to a semiconductor structure having a pad and a manufacturing method thereof.

Description of Related Art

In some semiconductor structures (e.g., dynamic random access memory (DRAM) structures), multiple photomasks must be used to form smaller sized pads, resulting in higher production costs. Therefore, the goal of reducing the number of photomasks required for the process of forming the pads and the cost of production is an ongoing effort.

SUMMARY

The disclosure provides a semiconductor structure and a manufacturing method thereof, which may reduce a number of photomasks required for a process of forming a pad and cost of production.

The disclosure provides a semiconductor structure including a substrate, multiple first pads, and multiple second pads. The first pads are disposed on the substrate and are separated from each other. The second pads are disposed on the substrate and are separated from each other. Each of the first pads and each of the second pads are separated from each other. A top-view shape of the each of the first pads is different from a top-view shape of the each of the second pads. A portion of the first pads surrounds the same second pad.

The disclosure provides a manufacturing method of a semiconductor structure, which includes the following. A substrate is provided. Multiple first pads and multiple second pads are formed on the substrate. A forming method of the first pads and the second pads includes performing a self-alignment double patterning (SADP) process. The first pads are separated from each other. The second pads are separated from each other. Each of the first pads is separated from the each of the second pads. A top-view shape of the each of the first pads is different from a top-view shape of the each of the second pads. A portion of the first pads surrounds the same second pad.

Based on the above, in the semiconductor structure and the manufacturing method thereof proposed by the disclosure, the semiconductor structure includes multiple first pads and multiple second pads, a top-view shape of each of the first pads is different from a top-view shape of each of the second pads, and a portion of the first pads surrounds the same second pad. Since the first pads and the second pads may be formed by the self-alignment double patterning process, the number of photomasks required for the process of forming the first pads and the second pads and the cost of production may be reduced, and an overlay window may be increased.

To make the aforementioned more comprehensive, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIG. 1A to FIG. 1M are top views of a manufacturing process of a semiconductor structure according to some embodiments of the disclosure. FIG. 2A to FIG. 2M are sectional views along a I-I' section line and a II-II' section line in FIG. 1A to FIG. 1M. In the top view of this embodiment, some components in the sectional view may be omitted to clearly illustrate the positional relationship between the components in the top view.

Figure 1A:
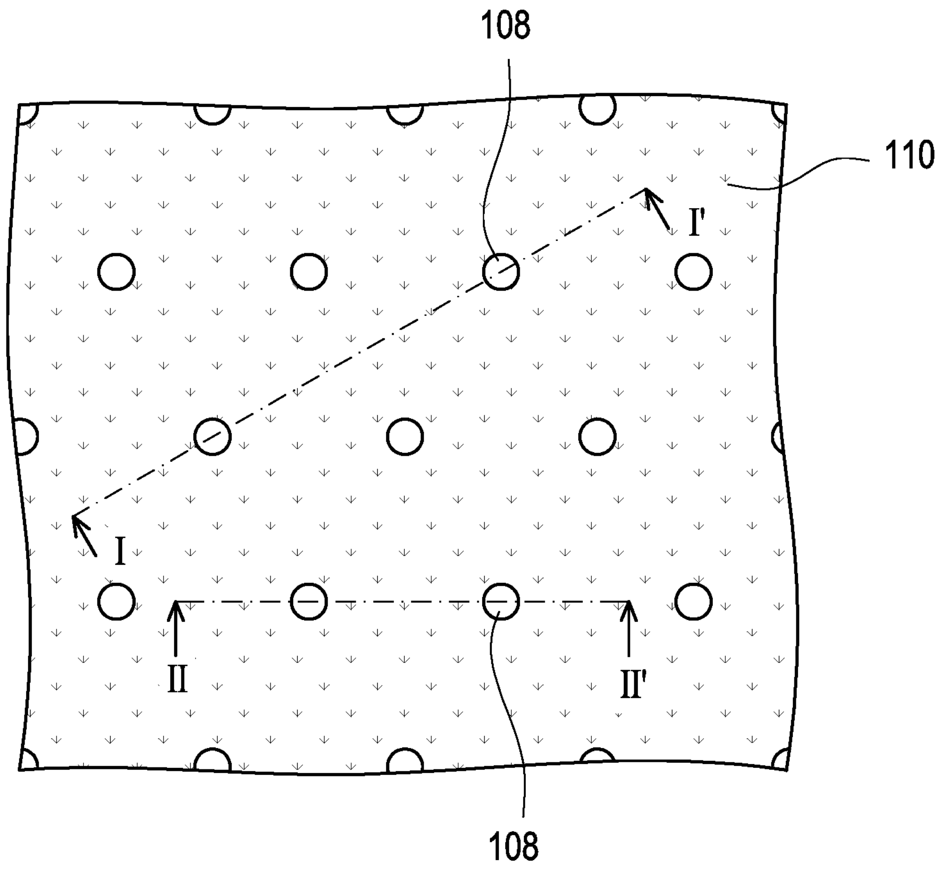
FIG. 1A to FIG. 1M are top views of a manufacturing process of a semiconductor structure according to some embodiments of the disclosure.
Figure 2A:
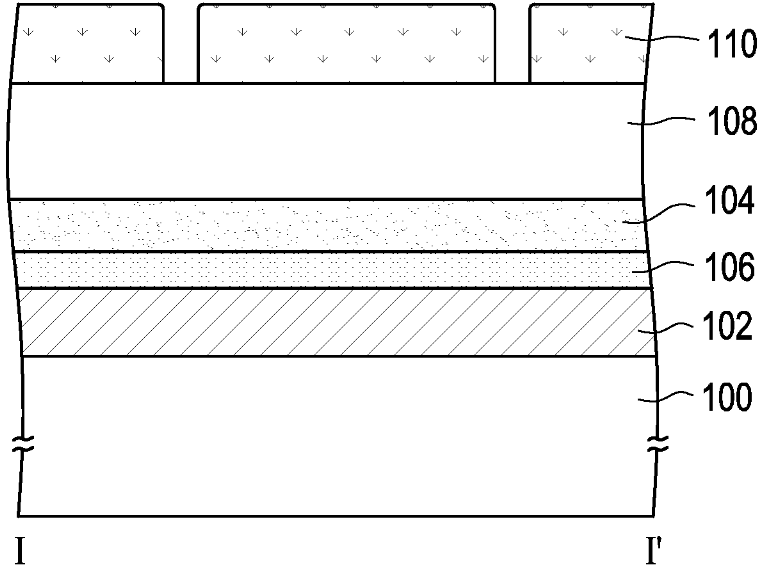
FIG. 2A to FIG. 2M are sectional views along a I-I' section line and a II-II' section line in FIG. 1A to FIG. 1M.
Figure 2A:
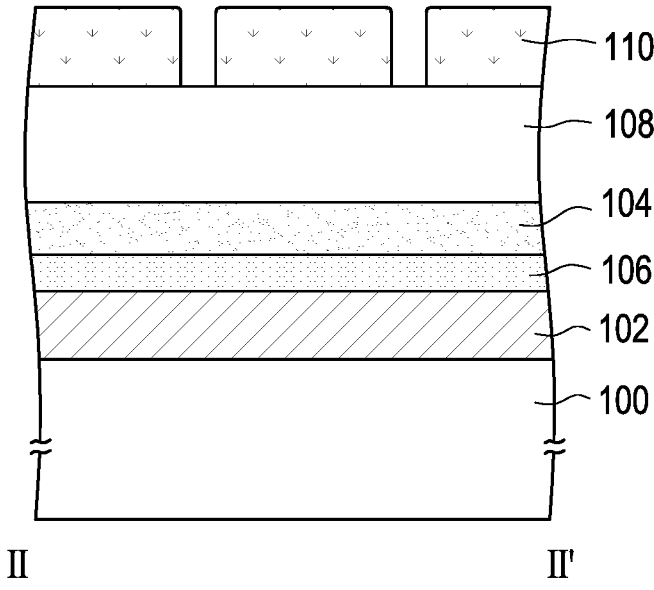

Referring to FIG. 1A and FIG. 2A, a substrate 100 is provided. In some embodiments, the substrate 100 may be a semiconductor substrate, such as a silicon substrate. In addition, although not shown in the figure, required components may be formed in and/or on the substrate 100. For example, when the semiconductor structure to be formed is a dynamic random access memory structure, required components (not shown) such as buried word line structures and doped regions may be formed in the substrate 100, and the required components (not shown) such as dielectric layers, bit lines, and contacts may be formed on the substrate 100, the description of which is omitted herein.

Next, a pad material layer 102 may be formed on the substrate 100. The pad material layer 102 may be a single-layer structure or a multi-layer structure. In some embodiments, a material of the pad material layer 102 may be a conductive material, such as tungsten, titanium nitride, or a combination thereof. In some embodiments, the pad material layer 102 is formed by, for example, physical vapor deposition or chemical vapor deposition. Then, a hard mask layer 104 may be formed on the pad material layer 102. In some embodiments, a material of the hard mask layer 104 is, for example, silicon oxynitride. In some embodiments, the hard mask layer 104 is formed by chemical vapor deposition, for example.

In some embodiments, a hard mask layer 106 may be formed on the pad material layer 102 before the hard mask layer 104 is formed, and the hard mask layer 104 may be formed on the hard mask layer 106. In some embodiments, a material of the hard mask layer 106 is, for example, silicon nitride. In some embodiments, the hard mask layer 106 is formed by chemical vapor deposition, for example.

Next, a dielectric layer 108 may be formed on the hard mask layer 104. In some embodiments, a material of the dielectric layer 108 is, for example, silicon oxide. In some embodiments, the dielectric layer 108 is formed by chemical vapor deposition, for example.

Subsequently, a patterned photoresist layer 110 may be formed on the dielectric layer 108. The patterned photoresist layer 110 may expose a portion of the dielectric layer 108. In some embodiments, the patterned photoresist layer 110 may be formed by a photolithography process.

Figure 1B:
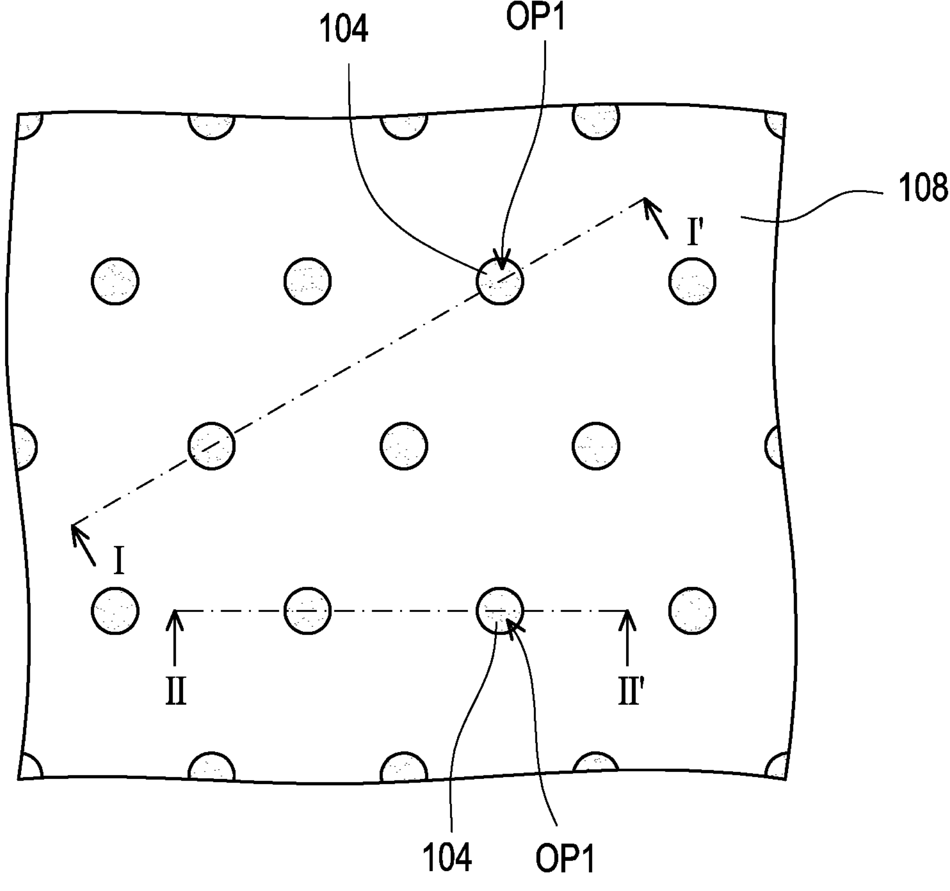
Figure 2B:
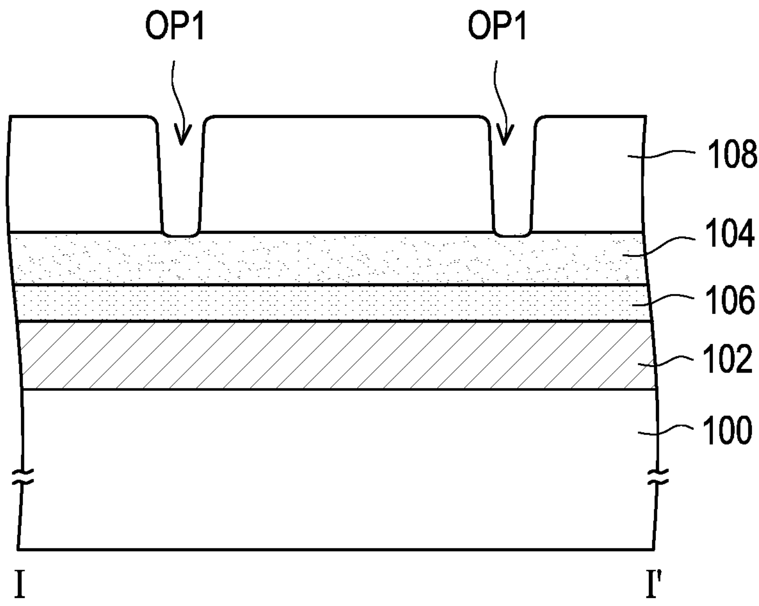
Figure 2B:
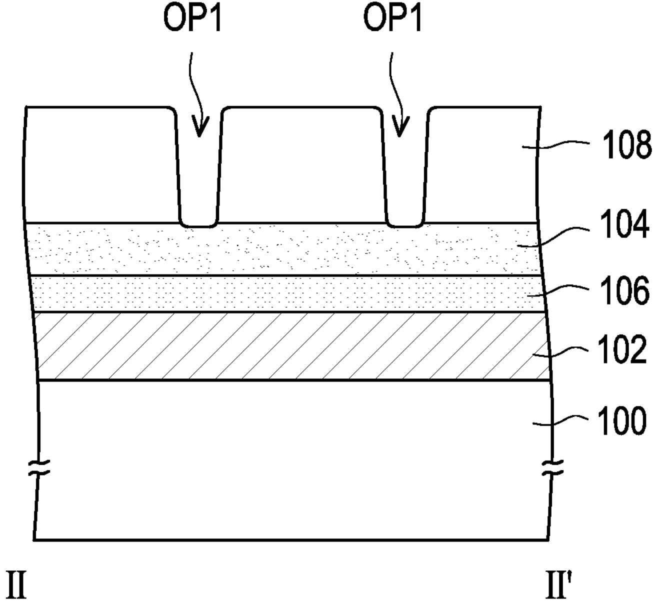

Referring to FIG. 1B and FIG. 2B, the patterned photoresist layer 110 may be used as a mask, and a portion of the dielectric layer 108 is removed to form multiple openings OP1 in the dielectric layer 108. The openings OP1 may expose a portion of the hard mask layer 104. In some embodiments, a portion of the dielectric layer 108 is removed by, for example, dry etching.

Next, the patterned photoresist layer 110 may be removed. In some embodiments, the patterned photoresist layer 110 is removed by, for example, dry stripping or wet stripping.

Figure 1C:
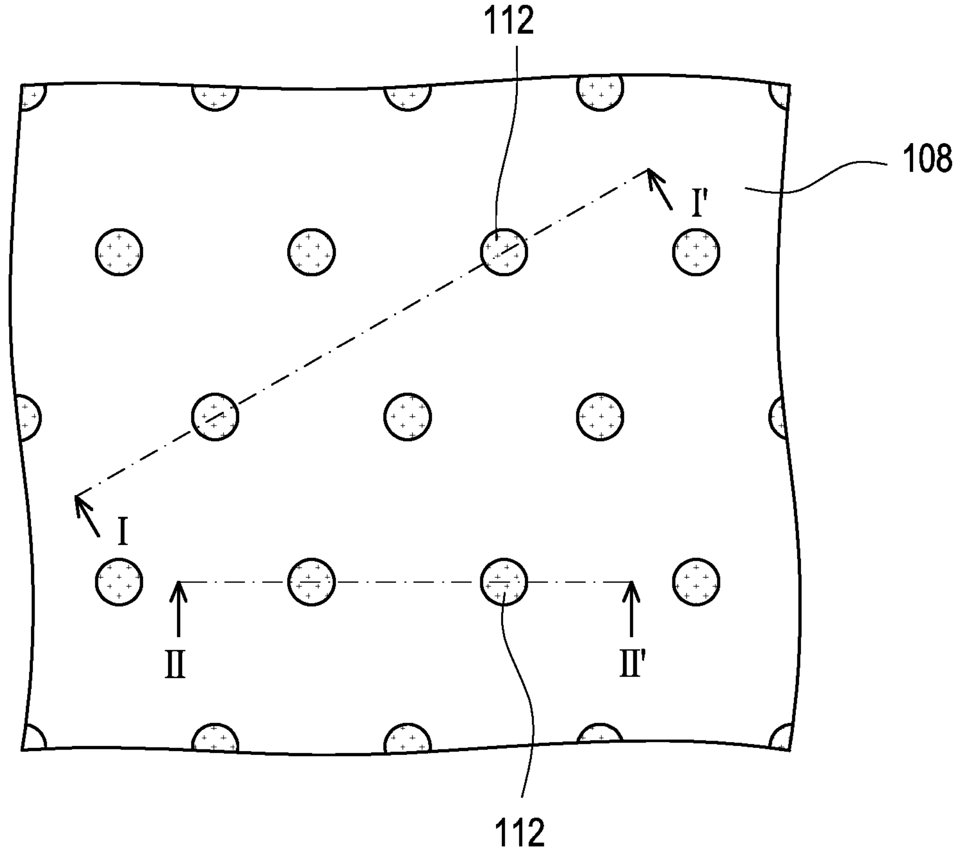
Figure 2C:
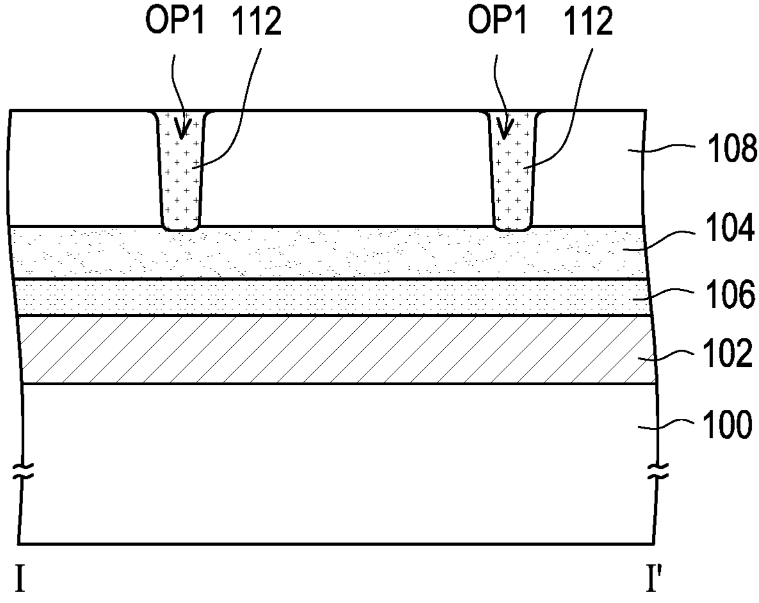
Figure 2C:
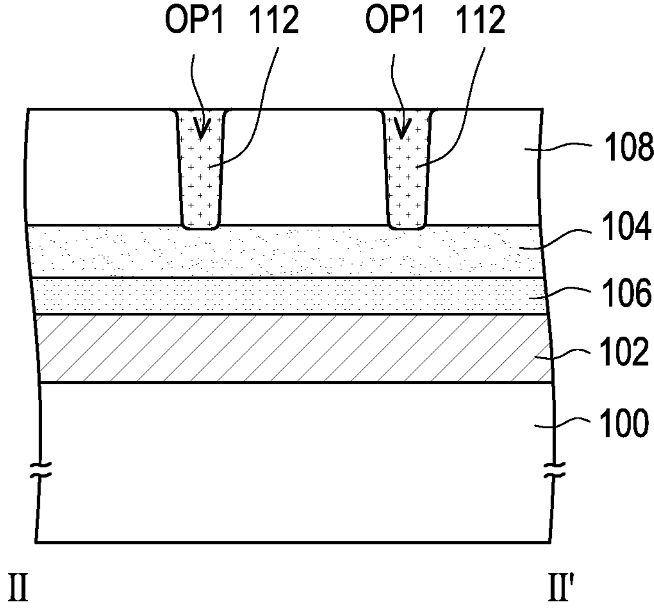

Referring to FIG. 1C and FIG. 2C, after the patterned photoresist layer 110 is removed, multiple sacrificial patterns 112 may be formed in the openings OP1. In this way, multiple sacrificial patterns 112 may be formed on the hard mask layer 104. In some embodiments, a material of the sacrificial patterns 112 is, for example, spin-on-carbon (SOC). In some embodiments, a forming method of the sacrificial patterns 112 may include the following steps. First, a sacrificial pattern material layer (not shown) filling the openings OP1 may be formed. In some embodiments, the sacrificial pattern material layer is formed by, for example, a spin coating method. Then, the sacrificial pattern material layer outside the openings OP1 may be removed to form the sacrificial patterns 112. In some embodiments, the sacrificial pattern material layer outside the openings OP1 is removed by, for example, an etch back method (e.g., dry etching).

Figure 1D:
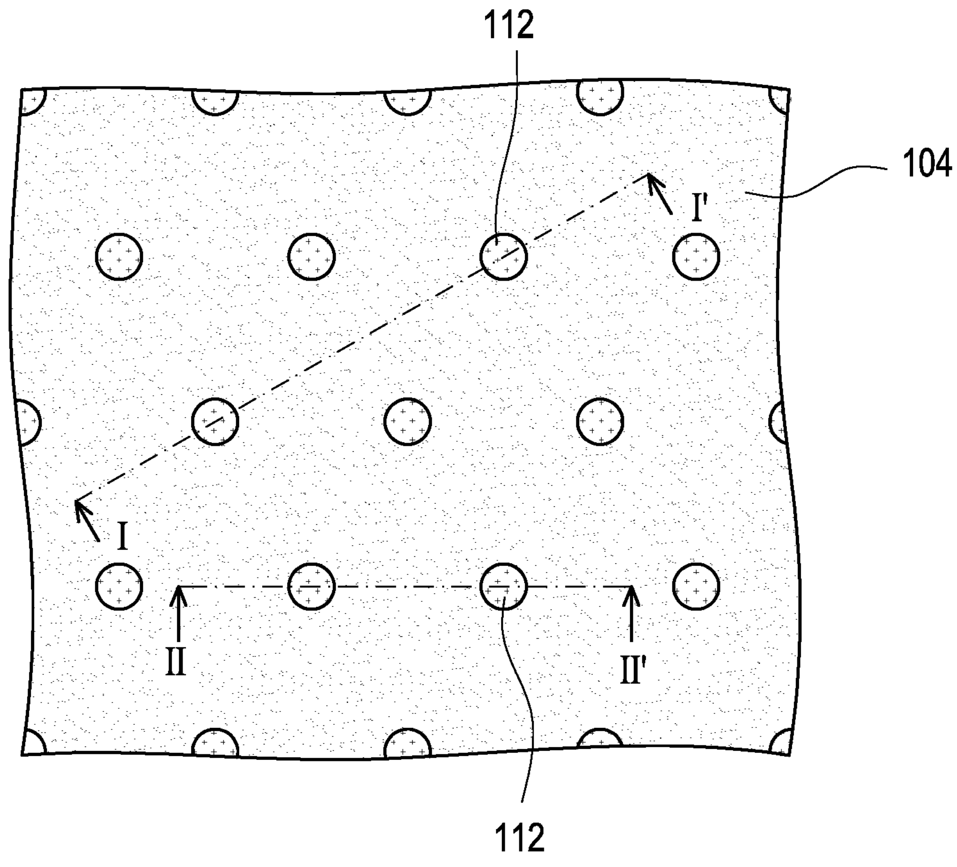
Figure 2D:
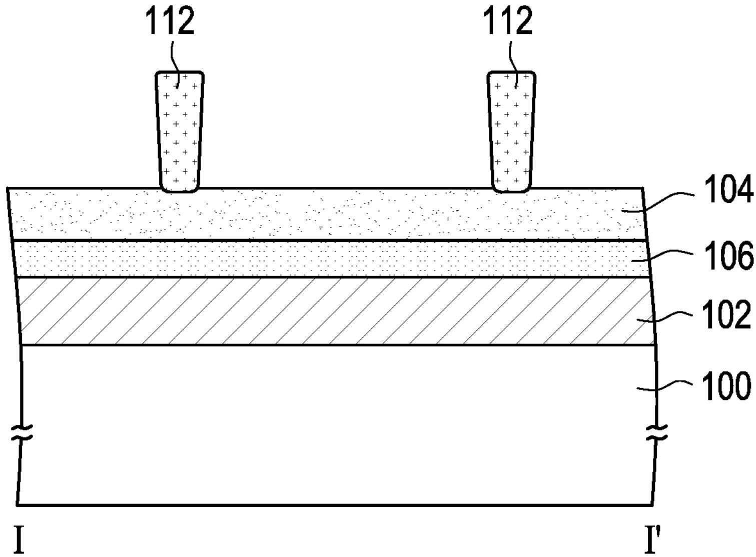
Figure 2D:
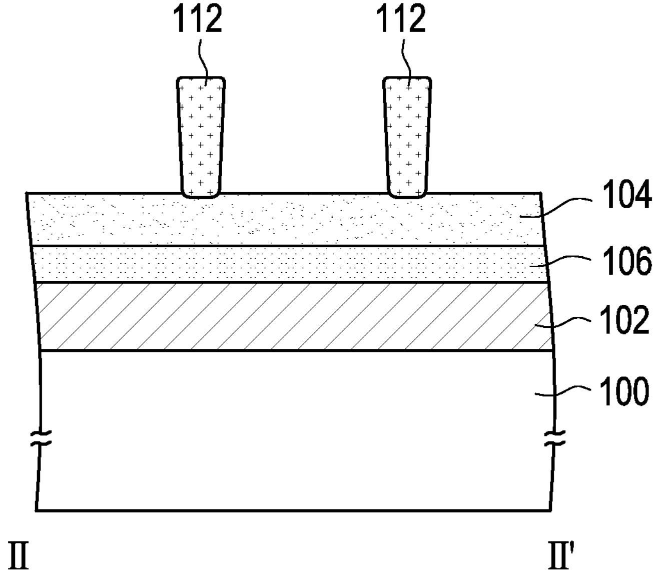

Referring to FIG. 1D and FIG. 2D, the dielectric layer 108 may be removed. In this way, the sacrificial patterns 112 may expose a portion of the hard mask layer 104. In some embodiments, the dielectric layer 108 is removed by, for example, a wet etching method.

Figure 1E:
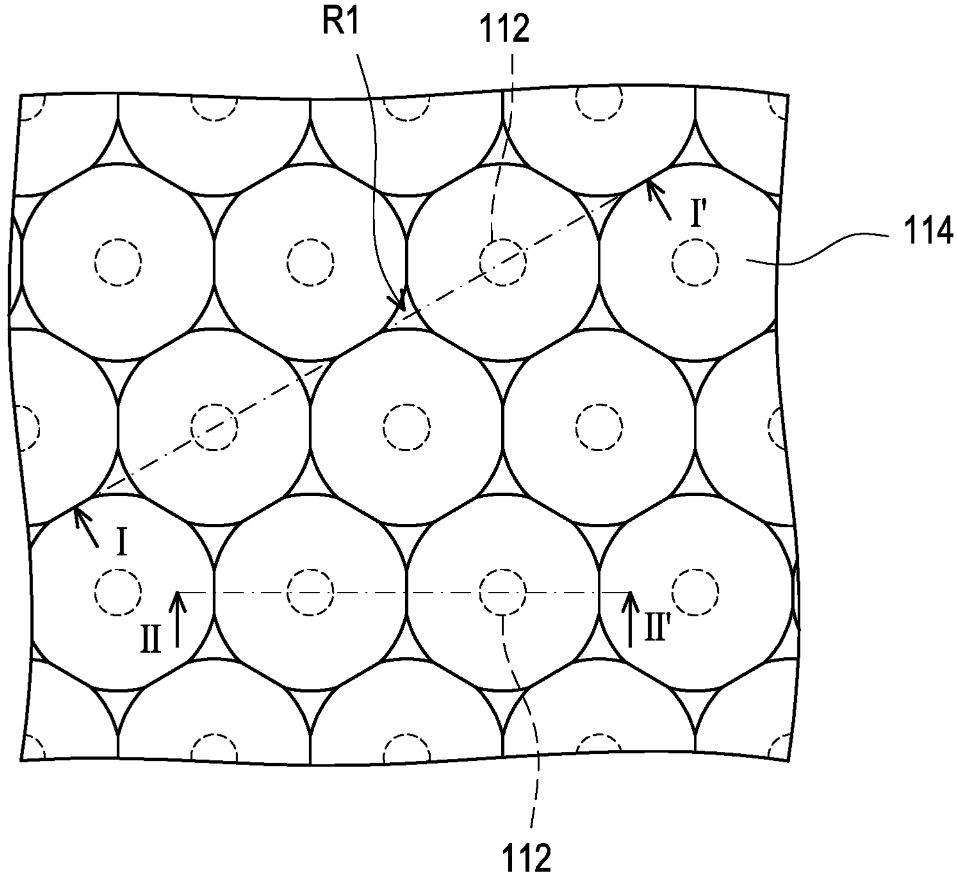
Figure 2E:
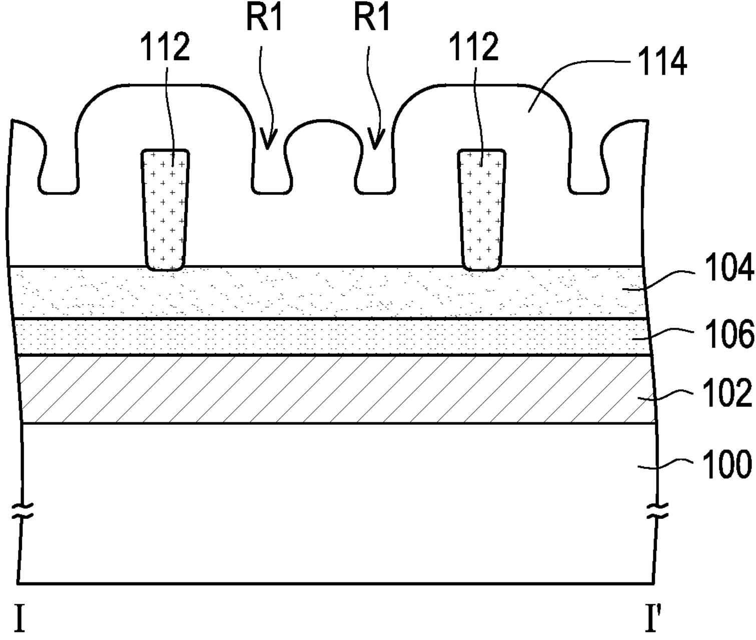
Figure 2E:
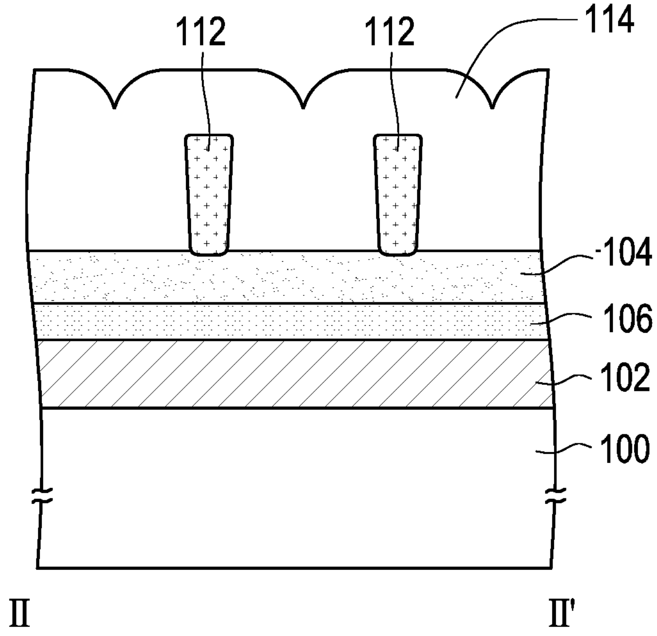

Referring to FIG. 1E and FIG. 2E, a spacer material layer 114 may be formed on the hard mask layer 104. The spacer material layer 114 may fill spaces between the sacrificial patterns 112. The spacer material layer 114 may have multiple recesses R1. In some embodiments, a top-view shape of the recesses R1 may be approximately triangular. Herein, the "approximately triangular" shape refers to a shape of a triangle with three sides recessed inwardly. In some embodiments, a material of the spacer material layer 114 is, for example, silicon oxide. In some embodiments, the spacer material layer 114 is formed by, for example, atomic layer deposition.

Figure 1F:
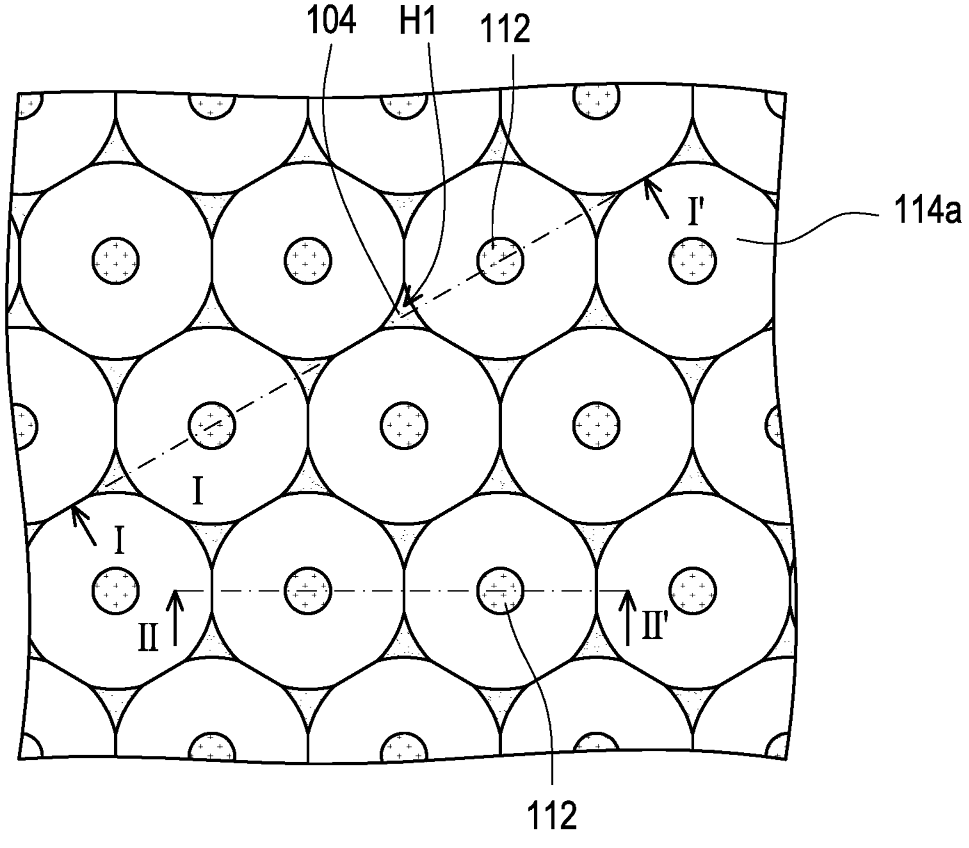
Figure 2F:
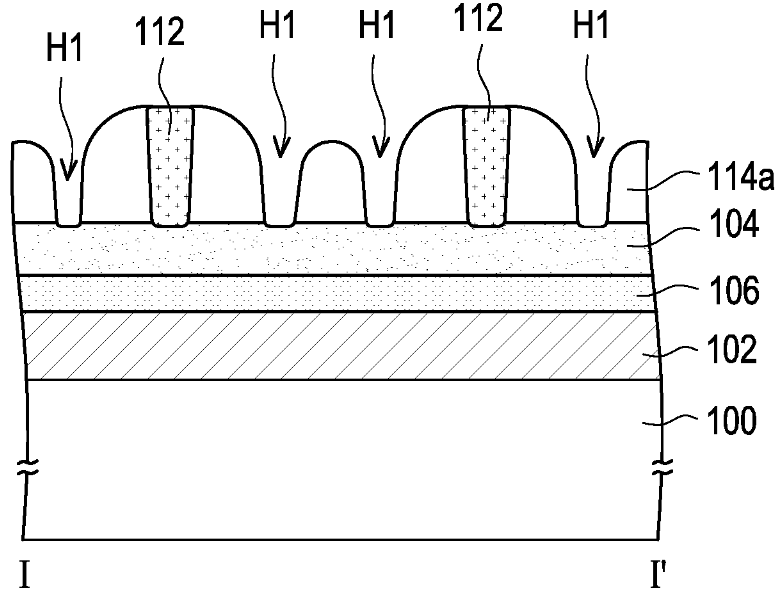
Figure 2F:
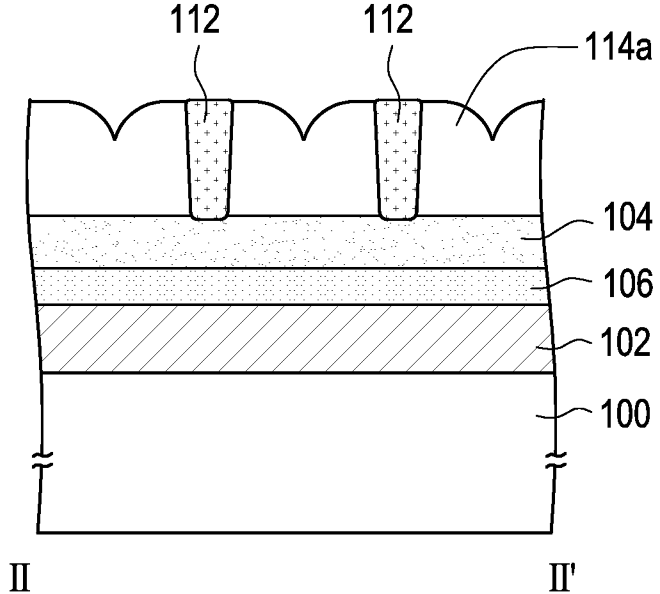

Referring to FIG. 1F and FIG. 2F, an etch-back process may be performed on the spacer material layer 114 to expose the sacrificial patterns 112 and form a spacer layer 114*a*. In the etch-back process, the recesses R1 may penetrate through the spacer material layer 114 to form multiple holes H1. The holes H1 may expose a portion of the hard mask layer 104. In some embodiments, the etch-back process is, for example, a dry etching process.

Figure 1G:
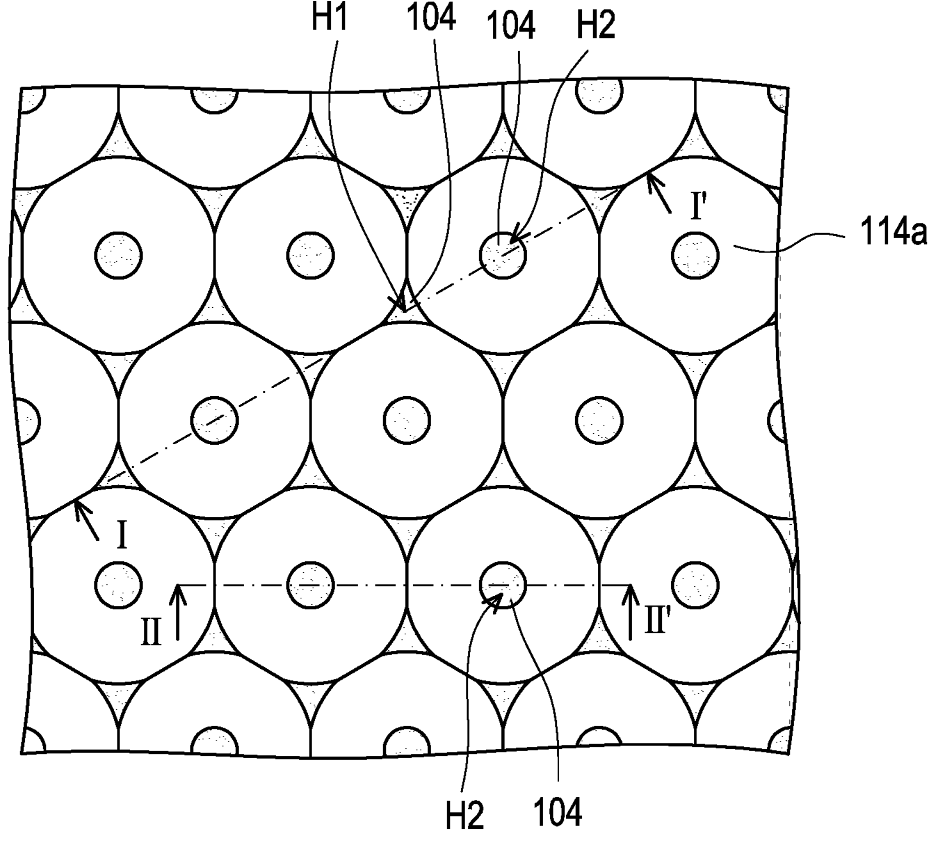
Figure 2G:
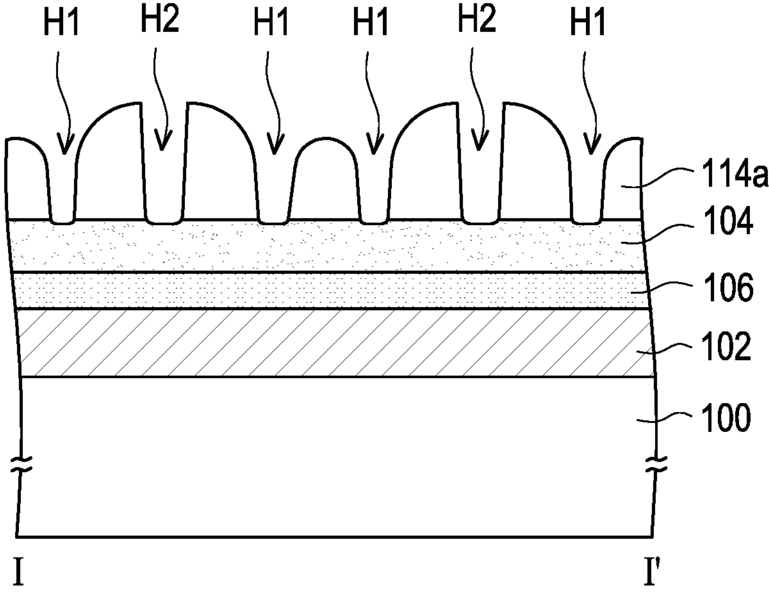
Figure 2G:
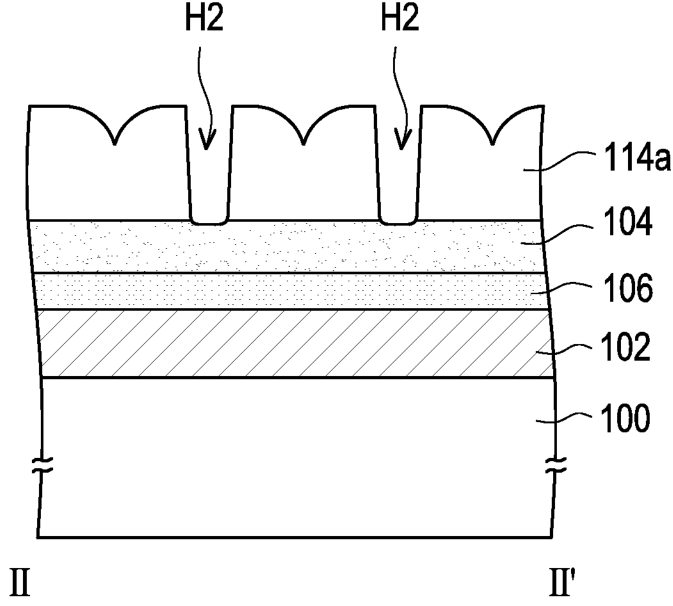

Referring to FIG. 1G and FIG. 2G, the sacrificial patterns 112 are removed, and multiple holes H2 are formed in the spacer layer 114 *a*. In some embodiments, the sacrificial patterns 112 is removed by, for example, an ashing method, such as oxygen plasma ashing.

In this embodiment, a self-alignment double patterning process may be performed by the above method to form the spacer layer 114 *a* on the hard mask layer 104. The spacer layer 114*a* may have multiple holes H1 and multiple holes H2. The holes H1 and the holes H2 may respectively expose a portion of the hard mask layer 104.

Figure 1H:
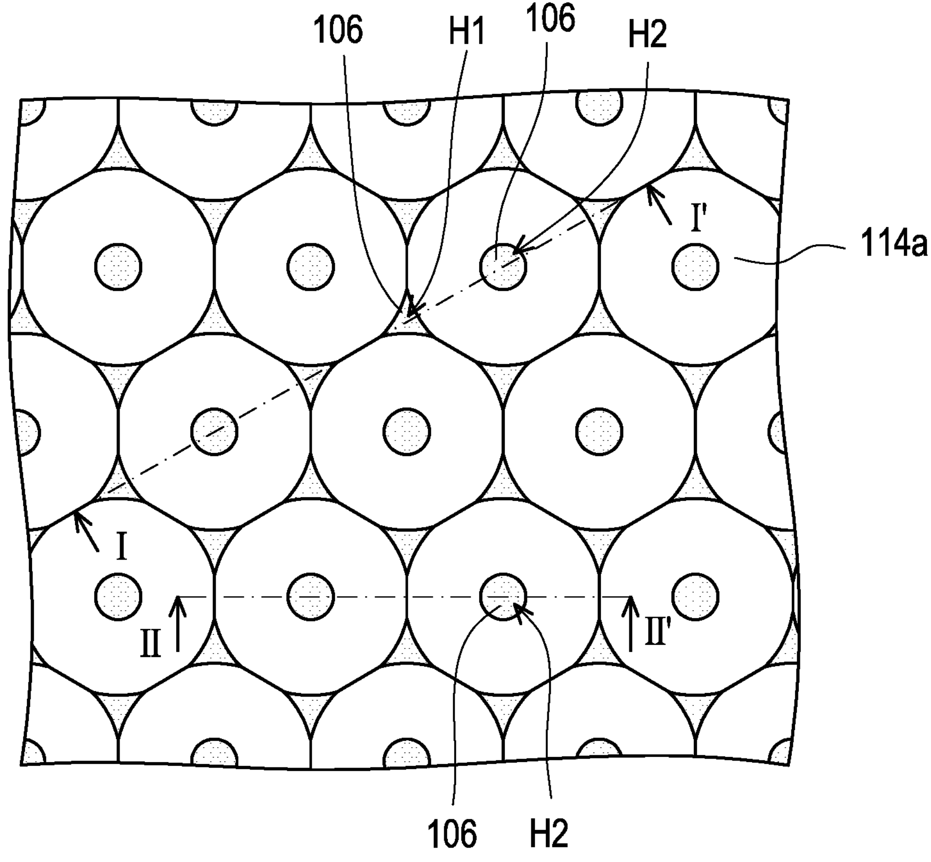
Figure 2H:
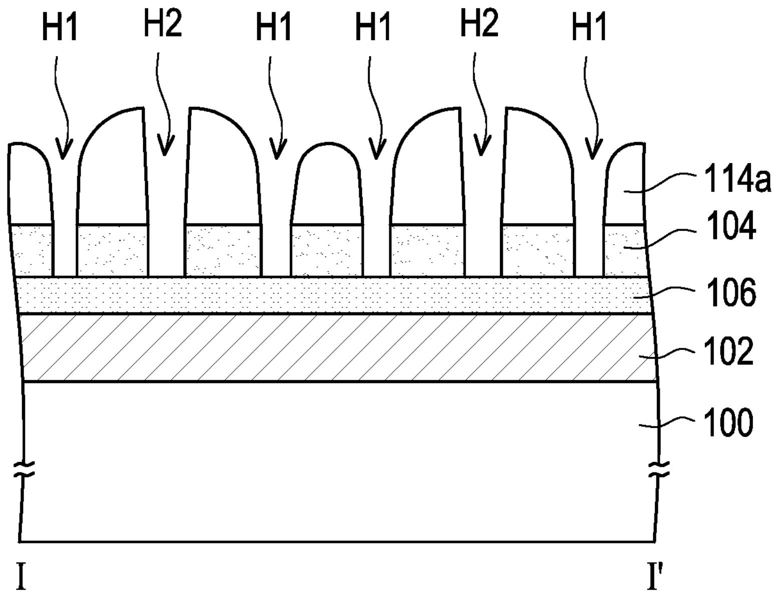
Figure 2H:
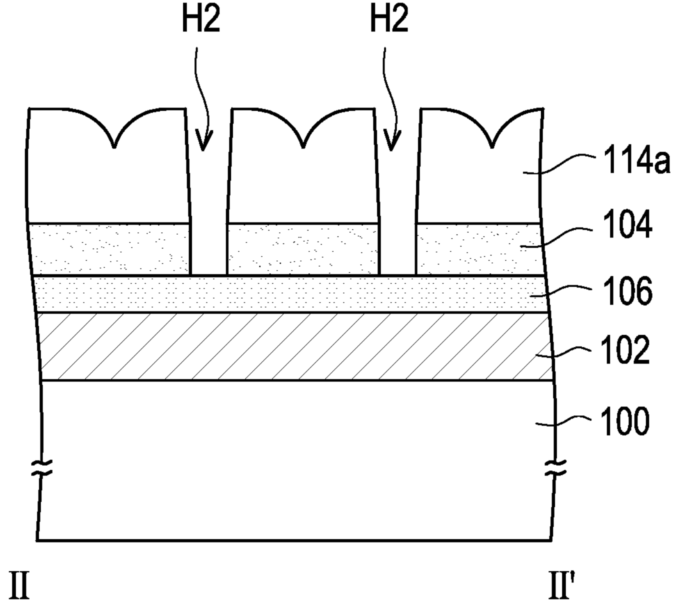

Referring to FIG. 1H and FIG. 2H, the holes H1 and the holes H2 may be extended into the hard mask layer 104. The holes H1 and the holes H2 may respectively expose a portion of the hard mask layer 106. In some embodiments, the spacer layer 114*a* may be used as a mask, and a portion of the hard mask layer 104 may be removed, so that the holes H1 and the holes H2 may be extended into the hard mask layer 104. In some embodiments, the portion of the hard mask layer 104 is removed by, for example, dry etching. In some embodiments, a size (e.g., width) of the holes H1 and a size (e.g., width) of the holes H2 may be adjusted by an etching process (e.g., dry etching process).

Figure 1I:
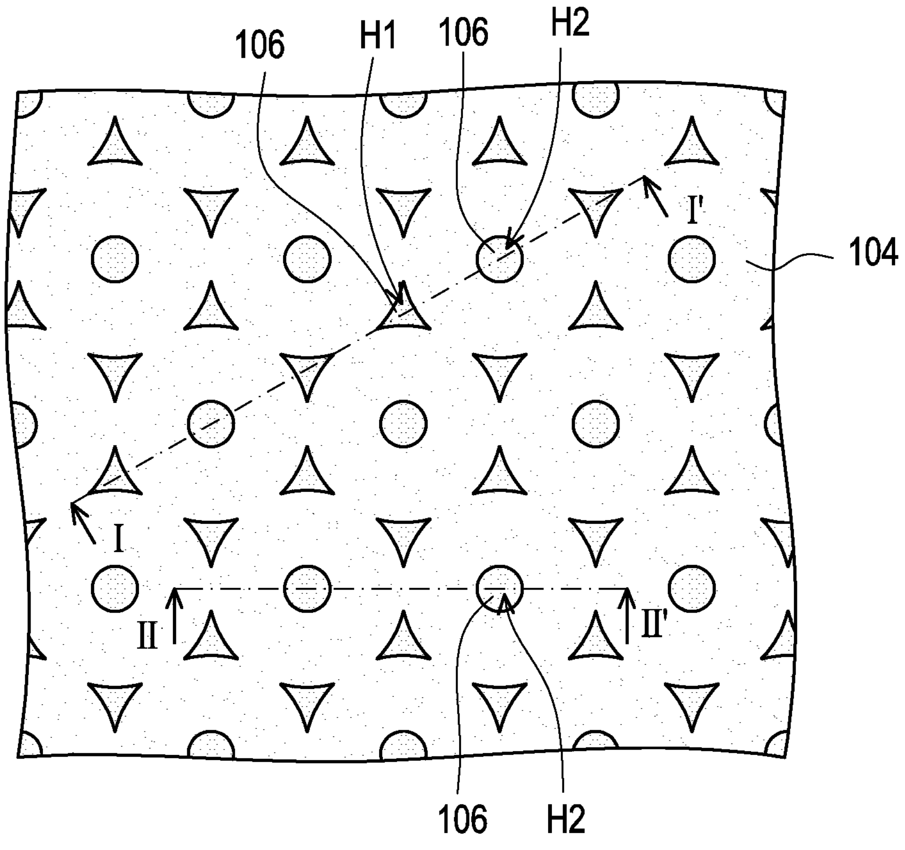
Figure 2I:
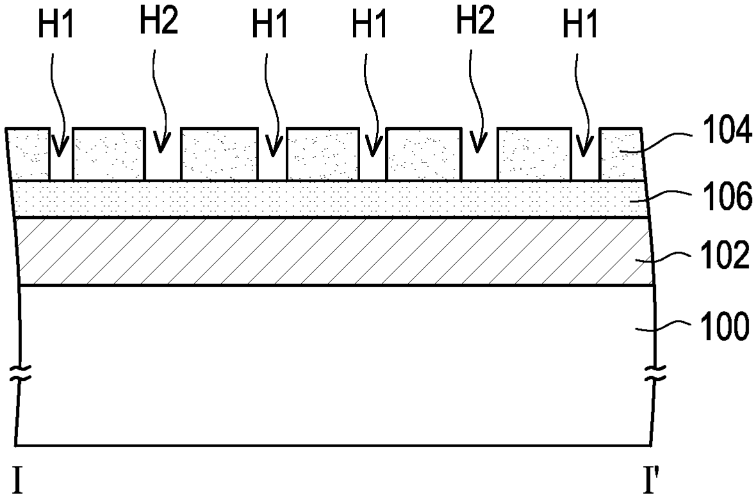
Figure 2I:
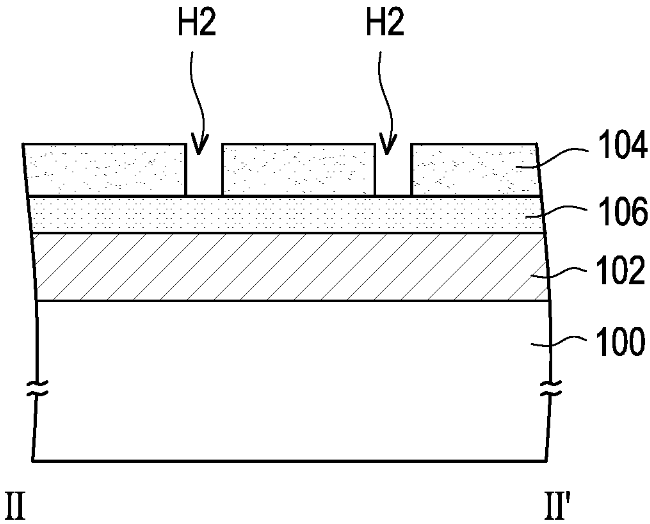

Referring to FIG. 1I and FIG. 2I, the spacer layer 114*a* may be removed. In some embodiments, a removal method of the spacer layer 114*a* includes a wet etching method. As shown in FIG. 1I, the holes H1 may be separated from each other, the holes H2 may be separated from each other, and each of the holes H1 and each of the holes H2 may be separated from each other. A top-view shape of the each of the holes H1 may be different from a top-view shape of the each of the holes H2. A portion of the holes H1 may surrounds the same hole H2. In some embodiments, the holes H1 may have the same top-view shape. In some embodiments, the holes H2 may have the same top-view shape. In some embodiments, the top-view shape of the holes H1 may be approximately triangular, and the top-view shape of the holes H2 may be approximately circular.

Figure 1J:
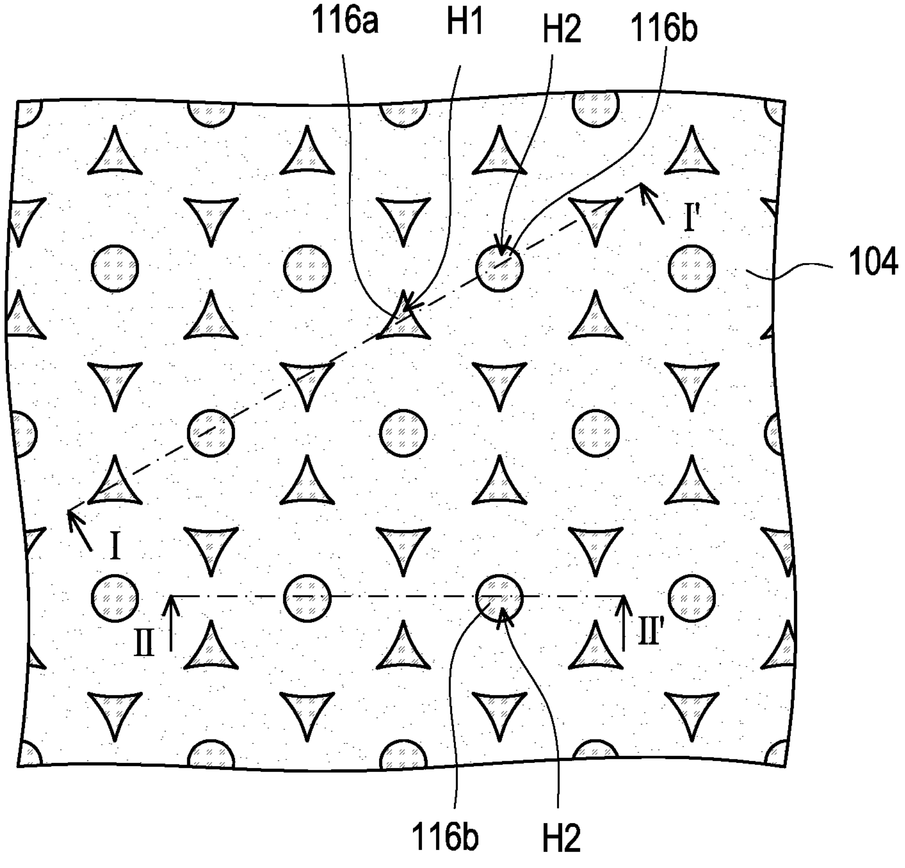
Figure 2J:
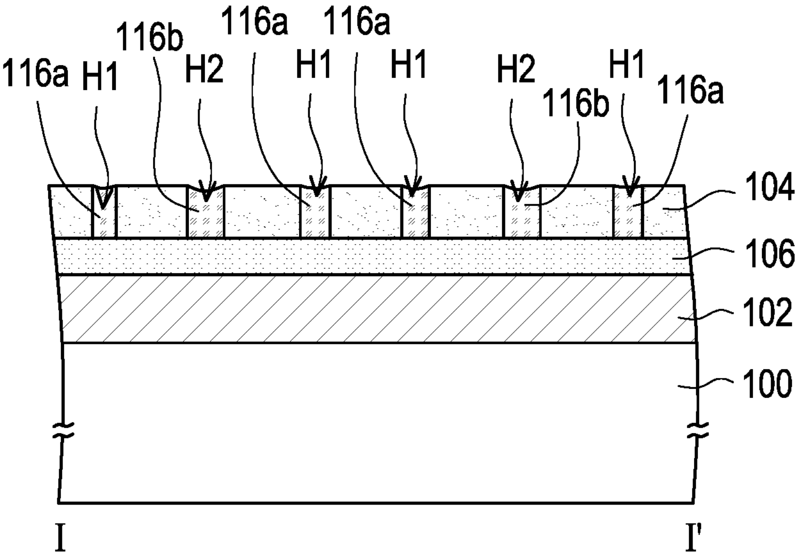
Figure 2J:
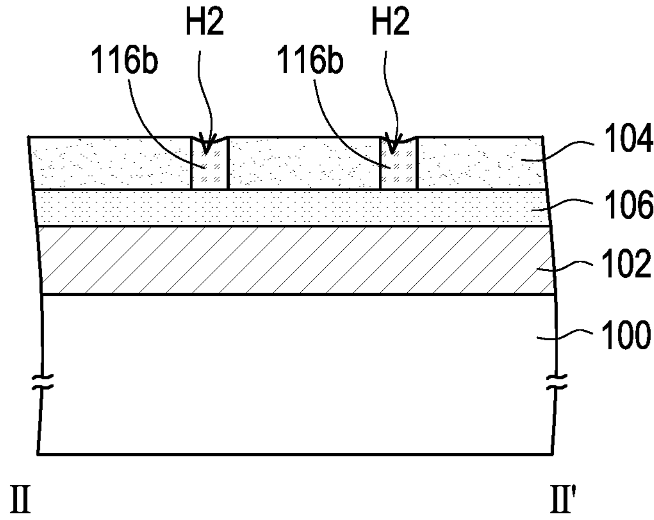

Referring to FIG. 1J and FIG. 2J, multiple hard mask patterns 116*a* are formed in the holes H1 in the hard mask layer 104, and multiple hard mask patterns 116*b* are formed in the holes H2 in the hard mask layer 104. In some embodiments, a material of the hard mask patterns 116*a* and the hard mask patterns 116*b* is, for example, silicon oxide. In some embodiments, a forming method of the hard mask patterns 116*a* and the hard mask patterns 116*b* may include the following steps. First, a hard mask material layer (not shown) filling the holes H1 and H2 may be formed. In some embodiments, the hard mask material layer is formed by, for example, atomic layer deposition. Then, the hard mask material layer outside the holes H1 and the holes H2 may be removed to form the hard mask patterns 116*a* and the hard mask patterns 116*b*. In some embodiments, the hard mask material layer outside the holes H1 and the holes H2 is removed by, for example, an etch back method (e.g., dry etching).

As shown in FIG. 1J, the hard mask patterns 116*a* may be separated from each other, the hard mask patterns 116*b* may be separated from each other, and each of the hard mask patterns 116*a* and each of the hard mask patterns 116*b* may be separated from each other. A top-view shape of the each of the hard mask patterns 116*a* may be different from a top-view shape of the each of the hard mask patterns 116*b*. A portion of the hard mask patterns 116*a* may surrounds the same hard mask pattern 116*b*. In some embodiments, the hard mask patterns 116*a* may have the same top-view shape. In some embodiments, the hard mask patterns 116*b* may have the same top-view shape. In some embodiments, the top-view shape of the hard mask patterns 116*a* may be approximately triangular, and the top-view shape of the hard mask patterns 116*b* may be approximately circular.

Figure 1K:
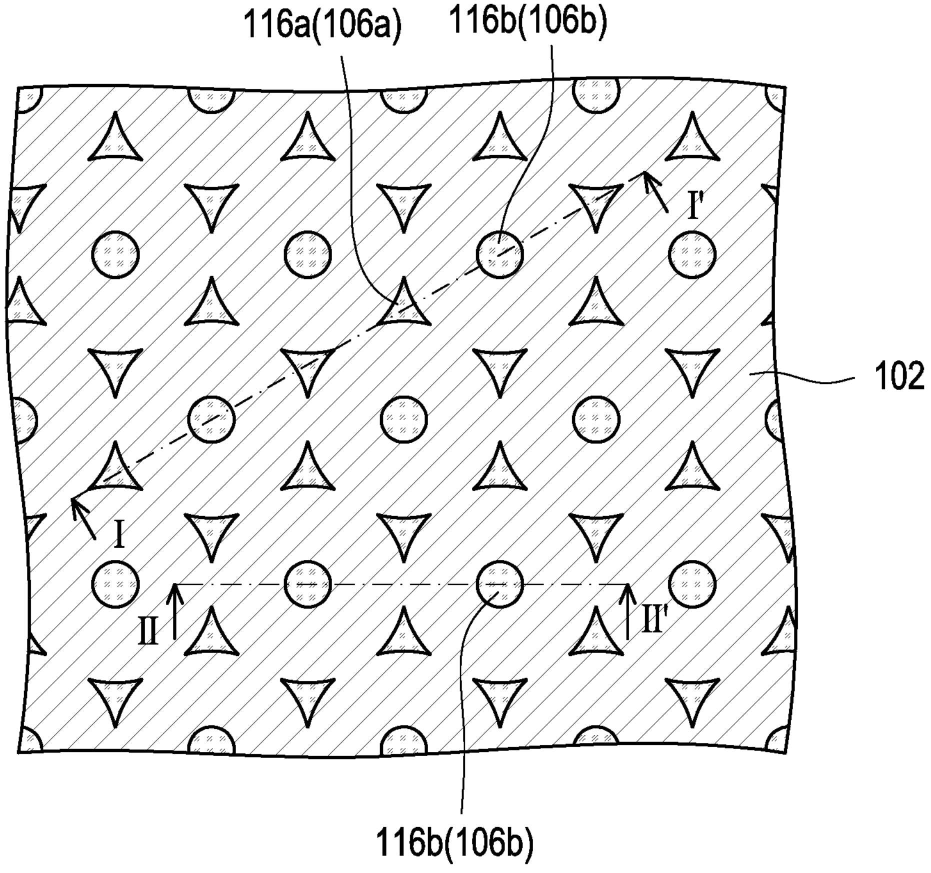
Figure 2K:
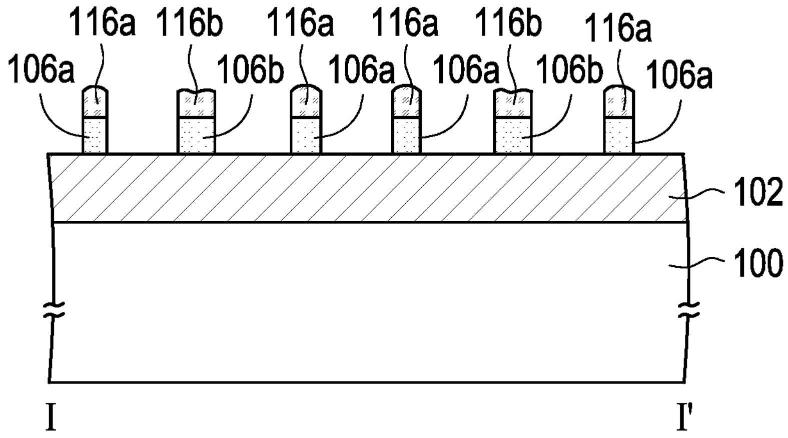
Figure 2K:
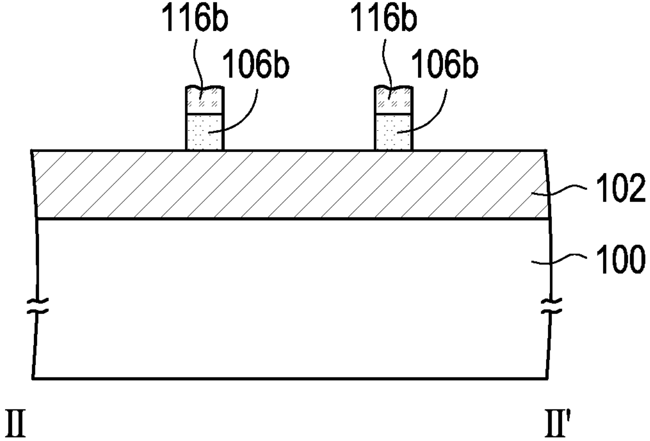

Referring to FIG. 1K and FIG. 2K, the hard mask layer 104 may be removed. The hard mask layer 104 is removed by, for example, dry etching. Then, the hard mask patterns 116*a* and the hard mask patterns 116*b* may be used as masks, and a portion of the hard mask layer 106 may be removed. In this way, the hard mask patterns 116*a* may be transferred to the hard mask layer 106 to form multiple hard mask patterns 106*a*, and the hard mask patterns 116*b* may be transferred to the hard mask layer 106 to form multiple hard mask patterns 106*b*. The hard mask patterns 106*a* and the hard mask patterns 106*b* may be located on the pad material layer 102. The portion of the hard mask layer 106 is removed by, for example, dry etching. In addition, a size (e.g., width) of the hard mask pattern 116*a*, a size (e.g., width) of the hard mask pattern 106*a*, a size (e.g., width) of the hard mask pattern 116*b*, and a size (e.g., width) of the hard mask pattern 106*b* may be adjusted by an etching process (e.g., dry etching process).

Figure 1L:
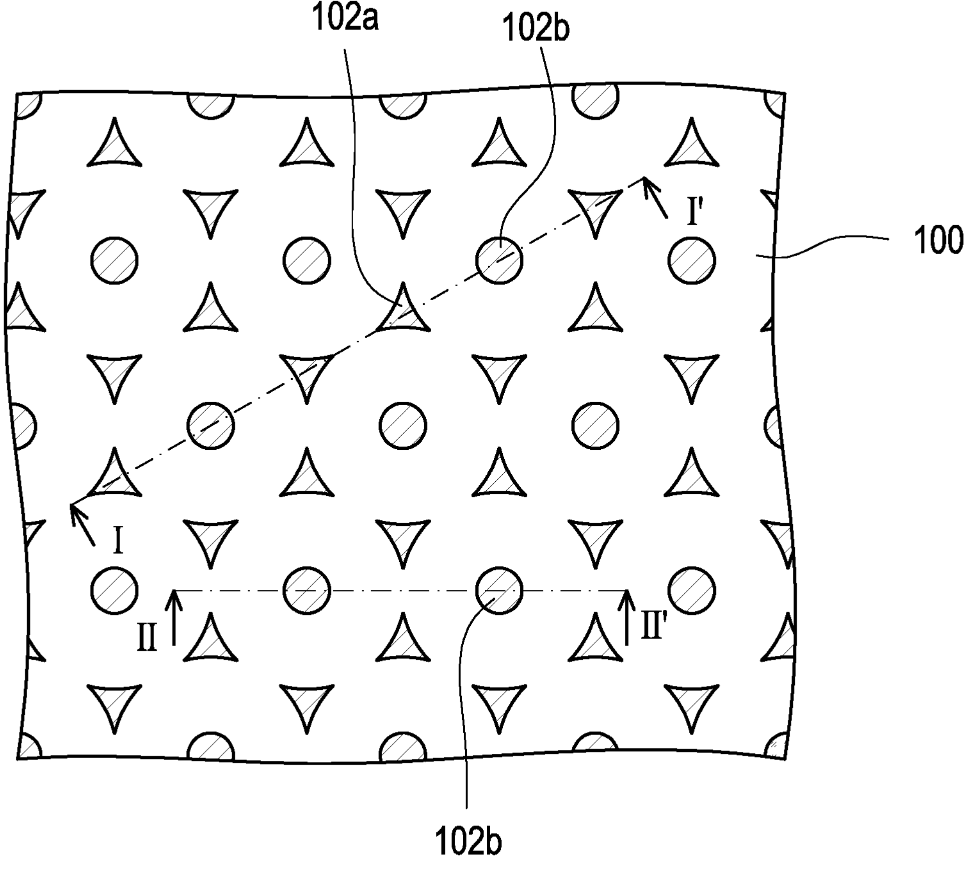
Figure 2L:
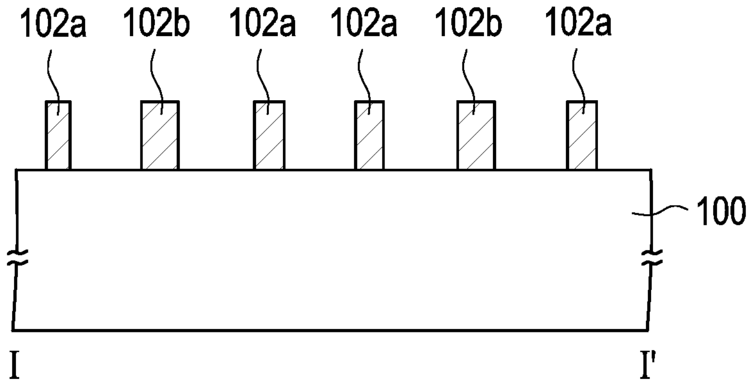
Figure 2L:
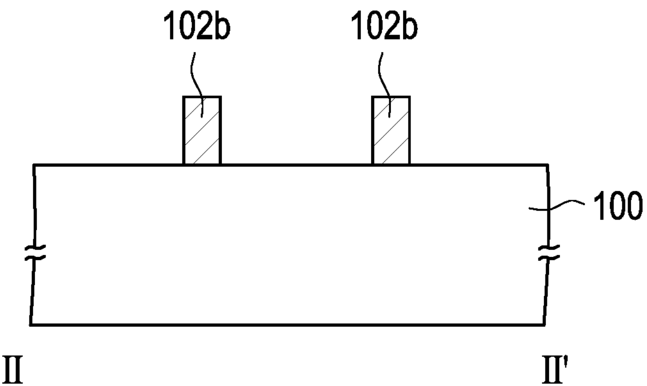

Referring to FIG. 1L and FIG. 2L, the hard mask patterns 116*a* and the hard mask patterns 116*b* may be used as masks, and a portion of the pad material layer 102 is removed. In this way, the hard mask patterns 116*a* may be transferred to the pad material layer 102 to form multiple pads 102*a*, and the hard mask patterns 116*b* may be transferred to the pad material layer 102 to form multiple pads 102*b*. In addition, the pads 102*a* and the pads 102*b* may be formed simultaneously. In this embodiment, the hard mask patterns 116*a*, the hard mask patterns 106*a*, the hard mask patterns 116*b*, and the hard mask patterns 106*b* may be used as masks, a portion of the pad material layer 102 is removed, and the hard mask patterns 116*a* are transferred to the pad material layer 102 and the hard mask patterns 116*b* are transferred to the pad material layer 102. In some embodiments, during the process of removing a portion of the pad material layer 102, the hard mask patterns 116*a*, the hard mask patterns 106*a*, the hard mask patterns 116*b*, and the hard mask patterns 106*b* may be removed simultaneously. The portion of the pad material layer 102 is removed by, for example, dry etching.

By the above method, multiple pads 102*a* and multiple pads 102*b* may be formed on the substrate 100. In addition, since a forming method of the pads 102*a* and the pads 102*b* includes performing a self-alignment double patterning (SADP) process, a number of photomasks required for the process of forming the pads 102*a* and the pads 102*b* and the cost of production may be reduced.

Figure 1M:
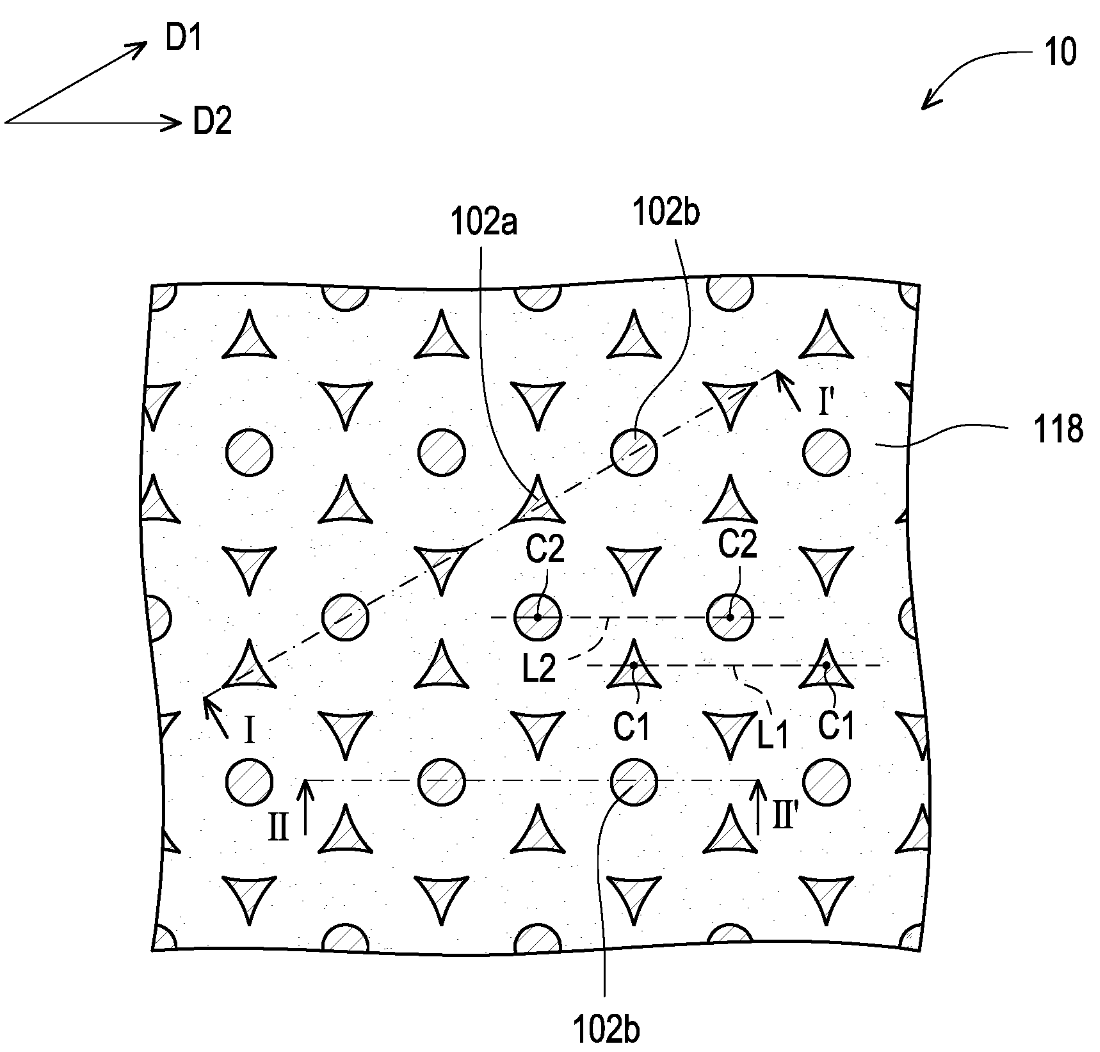
Figure 2M:
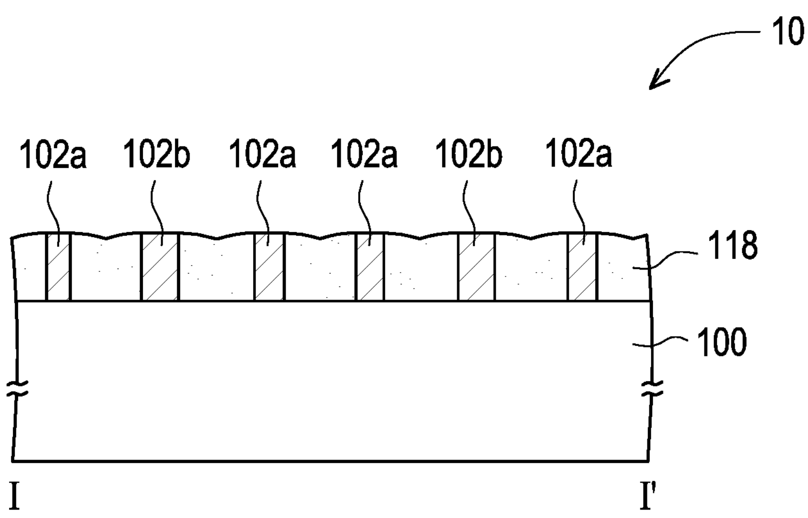
Figure 2M:
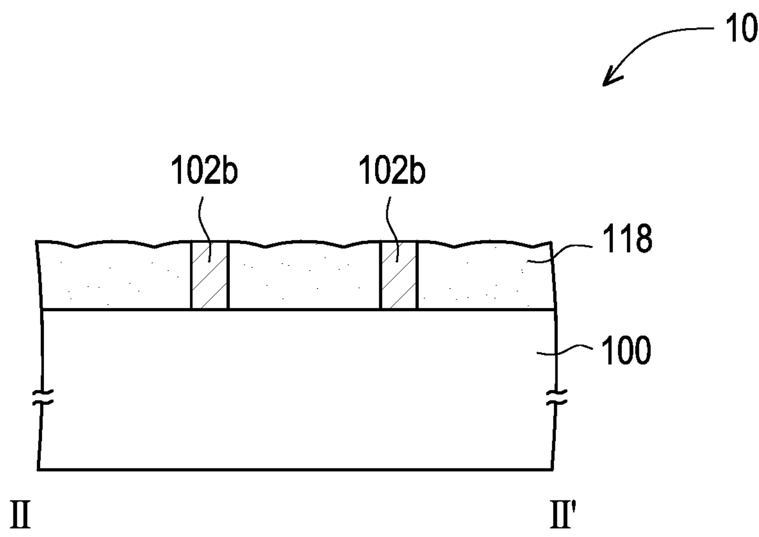

Referring to FIG. 1M and FIG. 2M, a dielectric layer 118 may be formed between the pads 102*a* and the pads 102*b*. In some embodiments, a material of the dielectric layer 118 is, for example, silicon nitride. In some embodiments, a forming method of the dielectric layer 118 may include the following steps. First, a dielectric material layer (not shown) filling spaces between the pads 102*a* and the pads 102*b* may be formed on the substrate 100. The dielectric material layer covers the pads 102*a* and the pads 102*b*. In some embodiments, the dielectric material layer is formed by, for example, chemical vapor deposition. Next, a dielectric material layer outside the spaces between the pads 102*a* and the pads 102*b* may be removed to form the dielectric layer 118. In some embodiments, the dielectric material layer outside the spaces between the pads 102*a* and the pads 102*b* is removed by, for example, an etch back method (e.g., dry etching).

Hereinafter, a semiconductor structure 10 of the above-mentioned embodiment is illustrated by FIG. 1M and FIG. 2M. In addition, although the forming method of the semiconductor structure 10 is illustrated by the above-mentioned method, the disclosure is not limited thereto.

Referring to FIG. 1M and FIG. 2M, the semiconductor structure 10 includes a substrate 100, multiple pads 102*a*, and multiple pads 102*b*. In some embodiments, the semiconductor structure 10 may be a dynamic random access memory structure, but the disclosure is not limited thereto. In the case where the semiconductor structure 10 is a dynamic random access memory structure, the semiconductor structure 10 may further include multiple transistor elements (not shown) and multiple capacitors (not shown). The pads 102*a* and the pads 102*b* may be located above the transistors, and the capacitors may be located above the pads 102*a* and the pads 102*b*. Each of the capacitors may be electrically connected to the corresponding transistor element through the pad 102*a* or the pad 102*b*. The each of the capacitors is electrically connected to the corresponding pad 102*a* or pad 102*b*. In addition, each of the pads 102*a* may be used as a landing pad for an electrode of the corresponding capacitor, and each of the pads 102*b* may be used as a landing pad for an electrode of the corresponding capacitor. In addition, the each of the pads 102*a* or the each of the pads 102*b* may be electrically connected to the corresponding transistor element through an interconnection structure (e.g., a contact).

The pads 102*a* are disposed on the substrate 100 and are separated from each other. The pads 102*b* are disposed on the substrate 100 and are separated from each other. The each of the pads 102*a* is separated from the each of the pads 102*b*. A top-view shape of the each of the pads 102*a* is different from a top-view shape of the each of the pads 102*b*. A portion of the pads 102*a* surrounds the same pad 102*b*. In some embodiments, the pads 102*a* may have the same top-view shape. In some embodiments, the pads 102*b* may have the same top-view shape. In some embodiments, the top-view shape of the pads 102*a* may be approximately triangular, and the top-view shape of the pads 102*b* may be approximately circular. The each of the pads 102*a* and the each of the pads 102*b* may be a single-layer structure or a multi-layer structure. In some embodiments, a material of the each of the pads 102*a* and a material of the each of the pads 102*b* may be conductive materials, such as tungsten, titanium nitride, or a combination thereof. In addition, the semiconductor structure 10 may further include the dielectric layer 118. The dielectric layer 118 is disposed between the pads 102*a* and the pads 102*b*.

In some embodiments, the pads 102*a* and the pads 102*b* may be arranged in a direction D1 and a direction D2, and the direction D1 may intersect with the direction D2. In some embodiments, two pads 102*a* may be between two adjacent pads 102*b* arranged in the direction D1. In some embodiments, a virtual straight line L1 passing through a center point C1 of two adjacent pads 102*a* arranged in the direction D2 may not pass through any one of the pads 102*b*. In some embodiments, a virtual straight line L2 passing through a center point C2 of two adjacent pads 102*b* arranged in the direction D2 does not pass through any one of the pads 102*a*. In some embodiments, the pads 102*a* and the pads 102*b* may be derived from the same material layer (e.g., the pad material layer 102 in FIG. 1K).

In addition, the details of each component of the semiconductor structure 10 (e.g., material and forming method, etc.) have been described in detail in the above-mentioned embodiments, and will not be further described in the following.

Based on the above embodiments, it can be seen that in the semiconductor structure 10 and the manufacturing method thereof, the semiconductor structure 10 includes multiple pads 102*a* and multiple pads 102*b*, the top-view shape of the each of the pads 102*a* is different from the top-view shape of the each of the pads 102*b*, and a portion of the pads 102*a* surrounds the same pad 102*b*. Since the pads 102*a* and the pads 102*b* may be formed by a self-alignment double patterning process, the number of photomasks required for the process of forming the pads 102*a* and the pads 102*b* and the cost of production may be reduced, and an overlay window may be increased.

Figure 3:
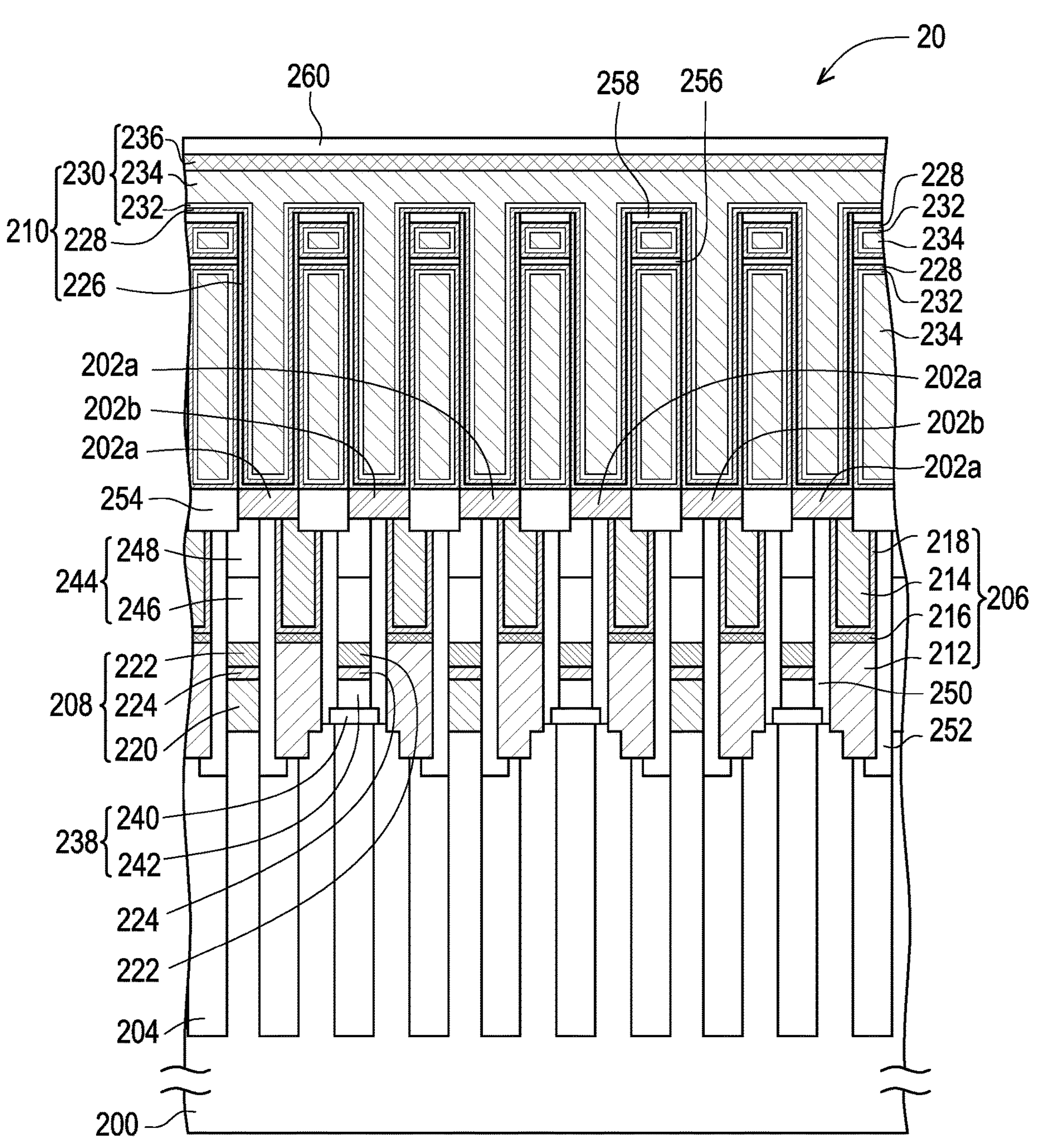
FIG. 3 is a cross-sectional view of a semiconductor structure according to other embodiments of the disclosure.

FIG. 3 is a cross-sectional view of a semiconductor structure according to other embodiments of the disclosure.

Referring to FIG. 3, a semiconductor structure 20 includes a substrate 200, multiple pads 202*a* and multiple pads 202*b*. In some embodiments, the semiconductor structure 20 may be a dynamic random access memory structure. The semiconductor structure 20 may further include an isolation structure 204. The isolation structure 204 is disposed in the substrate 200.

The pads 202*a* are disposed on the substrate 200 and are separated from each other. The pads 202*b* are disposed on the substrate 200 and are separated from each other. Each of the pads 202*a* is separated from each of the pads 202*b*. A top-view shape of the each of the pads 202*a* is different from a top-view shape of the each of the pads 202*b*. A portion of the pads 202*a* surrounds the same pad 202*b*. In addition, the details (e.g., the top-view shape, material, and forming method, etc.) of the pads 202*a* may be referred to the description of the pads 102*a* in the above embodiments, and the details (e.g., the top-view shape, material, and forming method, etc.) of the pads 202*b* may be referred to the description of the pads 102*b* in the above embodiments, and will not be described in the following.

The semiconductor structure 20 may further include multiple contact structures 206, a bit line structure 208, and multiple capacitor structures 210. The contact structures 206 may be closer to the substrate 200 than the capacitor structures 210. Each of the pads 202*a* and each of the pads 202*b* are located between the corresponding contact structure 206 and the corresponding capacitor structure 210, and are electrically connected to the corresponding contact structure 206 and the corresponding capacitor structure 210.

Each of the contact structures 206 may include a contact 212 and a contact 214. The contact 212 is disposed on the substrate 200. In some embodiments, a material of the contact 212 is, for example, doped polysilicon. The contact 214 is disposed on the contact 212. A material of the contact 214 is, for example, metal such as tungsten. In addition, the contact structure 206 may further include at least one of a metal silicide layer 216 and a barrier layer 218. The metal silicide layer 216 is disposed between the contact 212 and the contact 214. The barrier layer 218 is disposed between the contact 214 and the metal silicide layer 216.

The bit line structure 208 is disposed between two adjacent contact structures 206. The bit line structure 208 and the contact structure 206 may be insulated from each other. Each of the bit line structure 208 may include a contact 220 and a wire 222. In some embodiments, a material of the contact 220 is, for example, doped polysilicon. The wire 222 is located on the contact 220. In some embodiments, a material of the wire 222 is, for example, metal such as tungsten. In addition, the bit line structure 208 may further include a barrier layer 224. The barrier layer 224 is located between the wire 222 and the contact 220.

Each of the capacitor structures 210 may include an electrode 226, an insulating layer 228, and an electrode 230. In some embodiments, a material of the electrode 226 is, for example, Ti, TiN, or a combination thereof. The electrode 230 is located on the electrode 226. The insulating layer 228 is located between the electrode 226 and the electrode 230. The electrode 230 may have a single-layer structure or a multi-layer structure. In this embodiment, the electrode 230 is a multi-layer structure including a conductive layer 232, a conductive layer 234, and a conductive layer 236, for example, but the disclosure is not limited thereto. The conductive layer 232 is located on the insulating layer 228. In some embodiments, a material of the conductive layer 232 is, for example, Ti, TiN, or a combination thereof. The conductive layer 234 is located on the conductive layer 232. In some embodiments, a material of the conductive layer 234 is, for example, doped silicon germanium (SiGe). The conductive layer 236 is located on the conductive layer 234. In some embodiments, a material of the conductive layer 236 is metal such as tungsten.

The semiconductor structure 20 may further include a dielectric structure 238. A portion of the wire 222 may be located on the dielectric structure 238. A portion of the barrier layer 224 may be located between the wire 222 and the dielectric structure 238. In this embodiment, the dielectric structure 238 is a multi-layer structure including a dielectric layer 240 and a dielectric layer 242, for example, but the disclosure is not limited thereto. The dielectric layer 240 is located on the isolation structure 204. The dielectric layer 242 is located on the dielectric layer 240.

The semiconductor structure 20 may further include a hard mask layer 244. A hard mask layer 244 is disposed on the bit line structure 208. The hard mask layer 244 may be used to isolate the pad 202*a* from the bit line structure 208, and may be used to isolate the pad 202*b* from the bit line structure 208. The hard mask layer 244 may be a single-layer structure or a multi-layer structure. In this embodiment, the hard mask layer 244 is a multi-layer structure including a mask layer 246 and a mask layer 248, for example, but the disclosure is not limited thereto. The mask layer 246 is located on the wire 222. In some embodiments, a material of the mask layer 246 is, for example, silicon nitride. The mask layer 248 is located on the mask layer 246. In some embodiments, a material of the mask layer 248 is, for example, silicon nitride.

The semiconductor structure 20 may further include a spacer layer 250 and a spacer layer 252. The spacer layer 250 may be disposed on one sidewall of the contact structure 206, and the spacer layer 252 may be disposed on another sidewall of the contact structure 206.

The semiconductor structure 20 may further include a dielectric layer 254. The dielectric layer 254 may be disposed between a portion of the contact structures 206 and a portion of the capacitor structures 210. The dielectric layer 254 may be disposed between the pad 202*a* and the pad 202*b*. The dielectric layer 254 may be disposed between two adjacent pads 202*a*. The dielectric layer 254 may be a single-layer structure or a multi-layer structure. In some embodiments, a material of the dielectric layer 254 is, for example, silicon nitride.

The semiconductor structure 20 may further include at least one of a supporting layer 256 and a supporting layer 258. The supporting layer 256 and the supporting layer 258 may be disposed in the capacitor structure 210. The supporting layer 256 may be located between the supporting layer 258 and the dielectric layer 254. The supporting layer 256 and the supporting layer 258 may be separated from each other.

Based on the above embodiments, it can be seen that in the semiconductor structure 20, the semiconductor structure 20 includes multiple pads 202*a* and multiple pads 202*b*. The top-view shape of the each of the pads 202*a* is different from the top-view shape of the each of the pads 202*b*, and a portion of the pads 202*a* surrounds the same pad 202*b*. Since the pads 202*a* and the pads 202*b* may be formed by a self-alignment double patterning process, the number of photomasks required for the process of forming the pads 202*a* and the pads 202*b* and the cost of production may be reduced, and an overlay window may be increased.

It will be apparent to those skilled in the art that various modifications and variations can be made to the disclosed embodiments without departing from the scope or spirit of the disclosure. In view of the forthcoming, it is intended that the disclosure covers modifications and variations provided that they fall within the scope of the following claims and their equivalents.

What is claimed is:

1. A semiconductor structure comprising:
 a substrate;
 a plurality of first pads disposed on the substrate and separated from each other; and
 a plurality of second pads disposed on the substrate and separated from each other, wherein
  each of the first pads is separated from each of the second pads,
  a top-view shape of the each of the first pads is different from a top-view shape of the each of the second pads,
  a portion of the first pads surrounds the same second pad,
  the first pads of the portion of the first pads are arranged in a circular ring-shape to enclose only one of the second pads, and
  the first pads have the same top-view shape, the second pads have the same top-view shape, the top-view shape of the first pads is a shape of a triangle with three sides recessed inwardly, and the top-view shape of the second pads is circular.

2. The semiconductor structure according to claim 1, wherein the first pads and the second pads are arranged in a first direction and a second direction, and the first direction intersects with the second direction.

3. The semiconductor structure according to claim 2, wherein two of the first pads are between adjacent two of the second pads arranged in the first direction.

4. The semiconductor structure according to claim 2, wherein a virtual straight line passing through a center point of adjacent two of the first pads arranged in the second direction does not pass through any one of the second pads.

5. The semiconductor structure according to claim 2, wherein a virtual straight line passing through a center point of adjacent two of the second pads arranged in the second direction does not pass through any one of the first pads.

6. The semiconductor structure according to claim 1, wherein the first pads and the second pads are derived from the same material layer.

7. The semiconductor structure according to claim 1 further comprising:
 a plurality of contact structures;
 a bit line structure disposed between adjacent two of the contact structures; and
 a plurality of capacitor structures, wherein
  the contact structures are closer to the substrate than the capacitor structures, the each of the first pads is located between a corresponding one of the contact structures and a corresponding one of the capacitor structures, and is electrically connected to the corresponding one of the contact structures and the corresponding one of the capacitor structures, and
  the each of the second pads is located between a corresponding one of the contact structures and a corresponding one of the capacitor structures, and is electrically connected to the corresponding one of the contact structures and the corresponding one of the capacitor structures.

8. A manufacturing method of a semiconductor structure comprising:
 provide a substrate; and
 forming a plurality of first pads and a plurality of second pads on the substrate, wherein
  forming the first pads and the second pads comprises performing a self-alignment double patterning process,
  the first pads are separated from each other,
  the second pads are separated from each other,
  each of the first pads is separated from each of the second pads,
  a top-view shape of the each of the first pads is different from a top-view shape of the each of the second pads,
  a portion of the first pads surrounds the same second pad,
  the first pads of the portion of the first pads are arranged in a circular ring-shape to enclose only one of the second pads, and
  the first pads have the same top-view shape, the second pads have the same top-view shape, the top-view shape of the first pads is a shape of a triangle with three sides recessed inwardly, and the top-view shape of the second pads is circular.

9. The manufacturing method of a semiconductor structure according to claim 8, wherein the first pads and the second pads are formed simultaneously.

10. The manufacturing method of a semiconductor structure according to claim 8, wherein forming the first pads and the second pads further comprises:
 forming a pad material layer on the substrate;
 forming a first hard mask layer on the pad material layer;
 performing the self-alignment double patterning process to form a spacer layer on the first hard mask layer, wherein the spacer layer has a plurality of first holes and a plurality of second holes, and the first holes and the second holes respectively expose a portion of the first hard mask layer;
 extending the first holes and the second holes into the first hard mask layer;
 removing the spacer layer;
 forming a plurality of first hard mask patterns in the first holes in the first hard mask layer, and forming a plurality of second hard mask patterns in the second holes in the first hard mask layer;
 removing the first hard mask layer; and
 transferring the first hard mask patterns to the pad material layer to form the first pads, and transferring the second hard mask patterns to the pad material layer to form the second pads.

11. The manufacturing method of a semiconductor structure according to claim 10, wherein the self-alignment double patterning process comprises:
 forming a plurality of sacrificial patterns on the first hard mask layer, wherein the sacrificial patterns expose a portion of the first hard mask layer;
 forming a spacer material layer on the first hard mask layer, wherein the spacer material layer fills spaces between the sacrificial patterns, and the spacer material layer has a plurality of recesses;
 performing an etch back process on the spacer material layer to expose the sacrificial patterns and form the spacer layer, wherein in the etch back process, the recesses penetrate through the spacer material layer to form the first holes; and
 removing the sacrificial patterns and forming the second holes in the spacer layer.

12. The manufacturing method of a semiconductor structure according to claim 11, wherein forming the sacrificial patterns comprises:
 forming a dielectric layer on the first hard mask layer;

forming a patterned photoresist layer on the dielectric layer;

using the patterned photoresist layer as a mask, and removing a portion of the dielectric layer to form a plurality of openings in the dielectric layer, wherein the openings expose a portion of the first hard mask layer;

removing the patterned photoresist layer; and forming the sacrificial patterns in the openings after removing the patterned photoresist layer.

13. The manufacturing method of a semiconductor structure according to claim 12 further comprising removing the dielectric layer.

14. The manufacturing method of a semiconductor structure according to claim 13, wherein removing the dielectric layer comprises a wet etching method.

15. The manufacturing method of a semiconductor structure according to claim 11, wherein a material of the sacrificial patterns comprises spin-on-carbon, and removing the sacrificial patterns comprises an ashing method.

16. The manufacturing method of a semiconductor structure according to claim 10, wherein transferring the first hard mask patterns to the pad material layer and transferring the second hard mask patterns to the pad material layer comprise:

using the first hard mask patterns and the second hard mask patterns as masks, and removing a portion of the pad material layer.

17. The manufacturing method of a semiconductor structure according to claim 16, wherein transferring the first hard mask patterns to the pad material layer and transferring the second hard mask patterns to the pad material layer further comprise:

forming a second hard mask layer on the pad material layer before forming the first hard mask layer;

transferring the first hard mask patterns to the second hard mask layer to form a plurality of third hard mask patterns, and transferring the second hard mask patterns to the second hard mask layer to form a plurality of fourth hard mask patterns; and using the first hard mask patterns, the third hard mask patterns, the second hard ask patterns, and the fourth hard mask patterns as masks, and removing a portion of the pad material layer.

18. The manufacturing method of a semiconductor structure according to claim 17, wherein transferring the first hard mask patterns to the second hard mask layer and transferring the second hard mask patterns to the second hard mask layer comprise:

using the first hard mask patterns and the second hard mask patterns as masks, and removing a portion of the second hard mask layer.

19. The manufacturing method of a semiconductor structure according to claim 8 further comprising:

forming a dielectric layer between the first pads and the second pads.

* * * * *